United States Patent
Fujiwara et al.

(10) Patent No.: US 10,494,261 B2
(45) Date of Patent: Dec. 3, 2019

(54) INORGANIC POLYSILAZANE RESIN

(71) Applicant: AZ ELECTRONIC MATERIALS (LUXEMBOURG) S.À R.L., Luxembourg (LU)

(72) Inventors: Takashi Fujiwara, Shizuoka (JP); Ralf Grottenmueller, Wiesbaden (DE); Takashi Kanda, Shizuoka (JP); Tatsuro Nagahara, Shizuoka (JP)

(73) Assignee: Ridgefield Acquisition, Luxembourg (LU)

( * ) Notice: Subject to any disclaimer, the term of this patent is extended or adjusted under 35 U.S.C. 154(b) by 254 days.

(21) Appl. No.: 15/591,796

(22) Filed: May 10, 2017

(65) Prior Publication Data

US 2017/0240423 A1    Aug. 24, 2017

Related U.S. Application Data

(62) Division of application No. 14/377,001, filed as application No. PCT/JP2013/052312 on Feb. 1, 2013, now abandoned.

(30) Foreign Application Priority Data

Feb. 8, 2012   (JP) ................. 2012-025066

(51) Int. Cl.
| | |
|---|---|
| C01B 33/08 | (2006.01) |
| H01L 21/02 | (2006.01) |
| C09D 183/00 | (2006.01) |
| C01B 21/087 | (2006.01) |
| C23C 18/12 | (2006.01) |
| C08G 77/62 | (2006.01) |
| C09D 183/16 | (2006.01) |
| C09D 1/00 | (2006.01) |
| C01B 33/12 | (2006.01) |

(52) U.S. Cl.
CPC ............ *C01B 21/087* (2013.01); *C01B 33/08* (2013.01); *C01B 33/126* (2013.01); *C08G 77/62* (2013.01); *C09D 1/00* (2013.01); *C09D 183/16* (2013.01); *C23C 18/122* (2013.01); *C23C 18/1212* (2013.01); *H01L 21/02164* (2013.01); *H01L 21/02222* (2013.01); *H01L 21/02282* (2013.01); *H01L 21/02323* (2013.01); *H01L 21/02326* (2013.01); *H01L 21/02337* (2013.01); *C23C 18/1225* (2013.01); *Y10T 428/31663* (2015.04)

(58) Field of Classification Search
CPC ............... H01L 21/316; C01B 33/12
See application file for complete search history.

(56) References Cited

U.S. PATENT DOCUMENTS

| | | | | |
|---|---|---|---|---|
| 2,721,812 | A | * | 10/1955 | Iler ................. C03C 25/40 428/391 |
| 4,535,007 | A | | 8/1985 | Cannady |
| 4,840,778 | A | | 6/1989 | Arai et al. |
| 5,145,812 | A | * | 9/1992 | Arai ................. C04B 35/589 501/88 |
| 5,319,121 | A | * | 6/1994 | Blum ................. C04B 35/16 501/88 |
| 5,905,130 | A | | 5/1999 | Nakahara et al. |
| 2012/0156893 | A1 | | 6/2012 | Ozaki et al. |

FOREIGN PATENT DOCUMENTS

| | | | | |
|---|---|---|---|---|
| EP | 2071616 | A1 | * 6/2009 | ............ C08G 77/62 |
| EP | 2071616 | A1 | 6/2009 | |
| EP | 0781815 | B1 | 11/2010 | |
| JP | 63-16325 | B2 | 4/1988 | |
| JP | 3015104 | B2 | 7/1992 | |
| JP | 4-240107 | A | 8/1992 | |
| JP | 4-252420 | A | 9/1992 | |
| JP | 5-319959 | A | 12/1993 | |
| JP | 6-73340 | A | 3/1994 | |
| JP | 6-299118 | A | 10/1994 | |
| JP | H1046108 | A | * 8/1996 | |
| JP | 9-31333 | A | 2/1997 | |
| JP | 9-15794 | A | 6/1997 | |
| JP | 9-275135 | A | 10/1997 | |
| JP | 10-46108 | A | 2/1998 | |

(Continued)

OTHER PUBLICATIONS

Machine Language English Abstract from JPO of JP JP 4-240107 A, Aug. 27, 1992.

(Continued)

*Primary Examiner* — Cachet I Proctor
(74) *Attorney, Agent, or Firm* — Francis M. Houlihan

(57) ABSTRACT

An inorganic polysilazane resin of the present invention has a Si/N ratio (i.e. a ratio of contained silicon atoms to contained nitrogen atoms) of 1.30 or more. The inorganic polysilazane resin having such a high Si content can be produced by, for example, a method in which an inorganic polysilazane compound containing both Si—NH and Si—Cl is heated to react NH with Cl, a method in which a silazane oligomer (polymer) that leaves no Si—Cl bond is synthesized and a dihalosilane is added to the synthesized silazane oligomer (polymer) to perform a thermal reaction, and the like. A siliceous film can be formed by, for example, applying a coating composition containing the inorganic polysilazane resin onto a base plate and then dried and the dried product is then oxidized by bringing the dried product into contact with water vapor or hydrogen peroxide vapor and water vapor under heated conditions.

10 Claims, No Drawings

(56) References Cited

FOREIGN PATENT DOCUMENTS

| JP | 2005-45230 A | 2/2005 | | |
|----|----|----|----|----|
| JP | 2007-142155 A | 6/2007 | | |
| JP | 2011-54898 A | 3/2011 | | |
| JP | 2011-142207 A | 7/2011 | | |
| WO | 1993-02472 A1 | 2/1993 | | |
| WO | WO-9302472 A1 * | 2/1993 | ....... | H01L 21/02126 |
| WO | 1997-24391 A1 | 7/1997 | | |

OTHER PUBLICATIONS

Machine Language English Abstract from JPO of JP 4-252420 A, Sep. 8, 1992.
Machine Language English Abstract from Espacenet and Translation from JPO of JP 3015104 B2, which is another publication for WO 93/02472 A1, Feb. 4, 1993.
Machine Language English Abstract from JPO of JP 2005-45230, Feb. 17, 2005.
Machine Language English Abstract from JPO of JP 9-31333, Feb. 4, 1997.
Machine Language English Abstract from JPO of JP 9-275135, Oct. 21, 1997.
Machine Language English Abstract from JPO of JP 2011-142207, Jul. 21, 2011.
Machine Language English Abstract from JPO of JP 9-157594, Jun. 17, 1997.
Machine Language English Abstract from JPO of JP 5-319959, Dec. 3, 1993.
Machine Language English Abstract from JPO of JP 10-46108, Feb. 17, 1998.
Machine Language English Abstract from JPO of JP 2007-142155, Jun. 7, 2007.
English Language of JP06-073340, Mar. 15, 1994.
Machine Language English translation of JP6-299118, Oct. 25, 1994.

* cited by examiner

INORGANIC POLYSILAZANE RESIN

This application is a Divisional Application which claims priority to U.S. Non Provisional application Ser. No. 14/377,001, filed Aug. 6, 2014, which is a National Stage Patent Application under 35 U.S.C. § 371 of International Patent Application No. PCT/JP2013/052312, filed Feb. 1, 2013, which claims priority to Japanese Patent Application No. 2012-025066, filed Feb. 8, 2012, the contents of which are being hereby incorporated herein by reference.

FIELD OF THE INVENTION

The present invention relates to an inorganic polysilazane resin, more specifically, to an inorganic polysilazane resin which can be suitably used for forming an insulation film, a passivation film, a planarization film, a protective film, a hard mask, a stress adjusting film, a sacrifice film, and the like of electronic devices such as a semiconductor element, etc. The present invention also relates to a coating composition containing the inorganic polysilazane resin, a method for forming a siliceous film by use of the inorganic polysilazane resin, and a siliceous film formed by the method.

BACKGROUND ART

A polysilazane is well known as a compound useful for a precursor of silicon nitride (for example, see Patent literature 1 below). In recent years, it has also attracted attention as a material for forming an insulation film such as an interlayer insulation film, a passivation film, a protective film, a planarization film, and the like of the electronic device such as a semiconductor device. These films are formed by applying a coating liquid containing a polysilazane to an appropriate substrate, followed by baking to transform the polysilazane to a siliceous film (for example, see Patent literatures 2 to 5 below).

In addition, in the electronic device such as a semiconductor device, a semiconductor element such as a transistor, a resistor, etc. are arranged on a substrate and for electrically isolating and separating these elements, an isolation region which is composed of an insulation film is formed between the elements by using a polysilazane. Furthermore, in the field of the electronic devices, densification and high integration of the elements have been proceeded and in order to cope with these densification and high integration, a trench isolation structure, which is produced by forming a fine groove on a surface of a semiconductor substrate and filling the groove with an insulating material to electrically separate between elements formed at both sides of the groove, has been adopted.

A coating liquid containing a polysilazane is used also in the aforementioned trench isolation structure. As a polysilazane used for forming insulation films including the trench isolation structure, passivation films, planarization films, protective films etc., there is exemplified, in Patent document 1, an inorganic polysilazane having a repeating unit represented by the following formula;

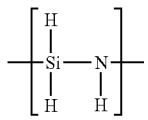

As a synthesis method of a polysilazane, Patent document 1 discloses a method in which adducts of dihalosilane with a base are reacted with ammonia. In addition to this, various other methods have been proposed for synthesizing a polysilazane, for example, (a) a method of reacting a silicon halide such as $SiCl_4$, $SiH_2Cl_2$ or the like with an amine, (b) a method of producing a polysilazane from a silazane by use of a dehydrogenating catalyst consisting of an alkali metal hydride such as KH, (c) a method of synthesizing a silazane by a dehydrogenation reaction of a silane compound with an amine compound by use of a transition metal complex catalyst, (d) a method of performing an amine exchange of aminosilane with ammonia by use of an acid catalyst such as $CF_4SO_3H$, (e) a method of performing an amine exchange of an aminosilane with a large amount of ammonia or amine, (f) a method of performing an amine exchange reaction of a polyvalent aminosilane with a polyhydrogenated nitrogen-containing compound in the presence of a basic catalyst, etc. (for example, see Patent document 6).

By the way, various properties such as an insulation property, a flatness of a film, a resistance for an acid, an alkali, a solvent, and the like, a high barrier property, and so on are required for the insulation film, the passivation film, the protective film, the planarization film, and the like in the electronic device such as the semiconductor device. Though a film fulfilling these properties can be produced by the aforementioned method for forming a siliceous film with a coating liquid containing a polysilazane, shrinkage of the film and a generation of a residual stress arise upon baking a polysilazane to convert into a siliceous film. When the shrinkage or residual stress of the film is large, there occur problems like that cracks and a crystal defect of the substrate. For this reason, a polysilazane which shrinkage and residual stress are suppressed as much as possible, are expected. In addition, it is desirable to form a high density siliceous film in order to obtain good etching properties in the trench isolation structure.

CITATION LIST

Patent document 1: JP 63-016325 B
Patent document 2: JP 2011-054898 A
Patent document 3: JP 2005-045230 A
Patent document 4: JP 09-031333 A
Patent document 5: JP 09-0275135 A
Patent document 6: WO 97/24391 A

SUMMARY OF THE INVENTION

Problems to be Solved by the Invention

The present invention was made under the situation above and an object of the present invention is to provide an inorganic polysilazane resin which can form a siliceous film having the same properties as those of the conventional siliceous film, i.e. a good insulation property, a good film planarity property, a high resistance to an acid, an alkaline and a solvent etc. and a high barrier property, as well as form a siliceous film with a small shrinkage and a small residual stress. Another object of the present invention is to provide a coating composition containing the inorganic polysilazane resin, a method for forming a siliceous film by using the inorganic polysilazene resin, and a siliceous film formed by the method for forming a siliceous film.

Means for Solving the Problems

As a result of intensive studies and investigations, the present inventors found that a ratio of silicon atoms and nitrogen atoms, which constitute the inorganic polysilazane resin, is important and when the ratio, Si/N is made 1.30 or more, a high density siliceous film was obtained and various properties of the siliceous film remain as it is, i.e. a good insulation property, a good film planarity, a high resistance to an acid, an alkaline and a solvent etc., and a high barrier property, and the problems of a shrinkage and residual stress of which are improved. The present invention was accomplished based on these findings.

The present invention, therefore, relates to an inorganic polysilazane resin, a coating composition containing the inorganic polysilazane resin, a method for forming a siliceous film by using the inorganic polysilazene resin, and a siliceous film formed by the method, as mentioned below.

(1) An inorganic polysilazane resin, wherein a ratio of containing silicon atoms to containing nitrogen atoms, Si/N is 1.30 or more, preferably 1.32 or more.

(2) The inorganic polysilazane resin described in (1) above, which weight-average molecular weight is 1,200 to 20,000 in terms of polystyrene.

(3) The inorganic polysilazane resin described in (1) or (2) above, which is produced by heating an inorganic polysilazane compound containing both Si—NH and Si—Cl to react NH with Cl.

(4) The inorganic polysilazane resin described in (3) above, wherein the heating is conducted in the presence of a catalyst.

(5) The inorganic polysilazane resin described in (4) above, wherein the catalyst is a tertiary amine.

(6) The inorganic polysilazane resin described in (1) or (2) above, which is produced by synthesizing a silazane oligomer or polymer with no Si—Cl bond and then adding a halosilane, for example, a dihalosilane to thermally react these compounds.

(7) A coating composition containing the inorganic polysilazane resin described in any one of (1) to (6) above.

(8) A method for forming a siliceous film, wherein the coating composition described in (7) above is applied to a substrate and oxidized by contacting with a water vapor under a heated condition after drying.

(9) A method for forming a siliceous film, wherein the coating composition described in (7) above is applied to a substrate and oxidized by contacting with a hydrogen peroxide vapor and a water vapor under a heated condition after drying.

(10) A siliceous film, which is formed by the method for forming a siliceous film described in (8) or (9) above.

(11) The siliceous film described in (10) above, a shrinkage of which is 15% or less.

Advantageous Effect of the Invention

As the inorganic polysilazane resin of the present invention has a high content of silicon, a siliceous film formed by using this resin can form a higher density siliceous film in comparison with a film formed by using a conventional polysilazane resin. By this reason, a siliceous film having a smaller shrinkage and a smaller residual stress than those of conventional siliceous films can be produced. Therefore, the inorganic polysilazane resin of the present invention is effective on eliminating cracks in the film and crystal defect of the substrate because the shrinkage and residual stress of the film are small, when using to form an insulation film, a passivation film, a protective film, a planarization film, and the like of the elements used in the field of electronic devices.

MODE FOR CARRYING OUT THE INVENTION

The inorganic polysilazane resin of the present invention is an inorganic polysilazane resin in which the ratio of containing silicon atoms to containing nitrogen atoms (Si/N) is made to 1.30 or more as described above. The ratio of containing silicon atoms to containing nitrogen atoms (Si/N) is preferably 1.32 or more, more preferably 1.40 or more. One solution for obtaining such inorganic polysilazane resin having a high silicon atom ratio such as 1.30 or more is to introduce a trifunctional nitrogen atom into the resin, wherein all of atomic bonds of a nitrogen atom are connected to silicon atoms as mentioned below.

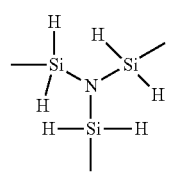

For example, an inorganic polysilazane resin produced by ammonolysis of dichlorosilane according to the method described in Patent literature 1 has usually a repeating unit represented by the following formula (I) mainly. Namely, it contains essentially a bifunctional nitrogen. The ratio of silicon atoms to nitrogen atoms (Si/N) of the polysilazane resin consisting of the following repeating unit is 1.0.

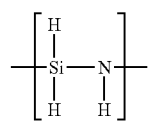
(I)

However, as a disproportionation reaction of hydrogen occurs at the synthesis actually, it is assumed that SiH and SiH$_3$ exist in the resin. When SiH is formed, it is assumed that the repeating unit represented by the following formula (II) is formed. The ratio of silicon atoms to nitrogen atoms (Si/N) of this repeating unit becomes 0.67.

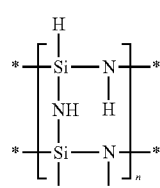
(II)

In contrast, a polymer containing a trifunctional nitrogen atom is represented by the following formula (III). In this case, the ratio of silicon atoms to nitrogen atoms (Si/N) of this repeating unit becomes 1.5.

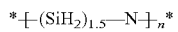
*—[(SiH$_2$)$_{1.5}$—N—]$_n$*  (III)

If SiH$_3$ exists at the terminal as shown in the following formula (X), the ratio of silicon atoms to nitrogen atoms (Si/N) does not fall below 2.0 though the value of the ratio may be changed by the molecular weight.

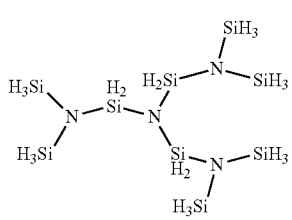

(X)

From these aspects, the polysilazane resin having a trifunctional nitrogen atom has a higher content by percentage of silicon atom in the repeating unit than that of the polysilazane resin having a bifunctional nitrogen atom. Accordingly, when the trench insulation film having a trench isolation structure is formed by using a polysilazane containing the trifunctional nitrogen atom, a film having a higher density will be able to be produced due to a larger amount of silicon will be introduced into the trench as compared with a case an insulation film is formed by using a polysilazane resin containing mainly a bifunctional nitrogen atom.

The inorganic polysilazane resin of the present invention, wherein the ratio of silicon atoms to nitrogen atoms is 1.30 or more, may be produced by an arbitrary method. As an example thereof, the number of the nitrogen atom having a trifunction linkage should be increased in the production of a polysilazane resin. For example, a method comprising the steps of;

(a) ammonolysis of dichlorosilane in an organic solvent to form an oligomer containing both chlorosilane and a NH group, (b) then, heating the system to polymerize the oligomer obtained in the step (a), and (c) terminal treatment of Si—Cl remained in the resin with ammonia, if necessary.

In the aforementioned example, a method using a dihalosilane as a halosilane is mentioned but the halosilane may be a trihalosilane or a tetrahalosilane. In addition, a catalyst may be added in the process of the step (b), if needed. A preferred compound as the catalyst is a tertiary amine.

As the step (a) which is a step producing the oligomer, arbitrary methods including conventionally known methods can be adopted. As an example thereof, there is a method for synthesizing a perhydropolysilazane (PHPS) at the same condition as that of a usual perhydropolysilazane except for adjusting the amount of ammonia introduced. The amount of ammonia introduced is suitably ⅔ mol relative to 1 mol of halosilane such as dichlorosilane, but is not limited to this. When ammonia is used in this ratio, an oligomer having a low degree of crosslinking and a high solubility in a solvent is given. If a larger amount of ammonia is used, N—H bonds will remain. On the other hand, if a smaller amount of ammonia is used, excess Si—Cl bonds remain. When the molar ratio of ammonia to dichlorosilane is made 2:3, the following oligomer is obtained.

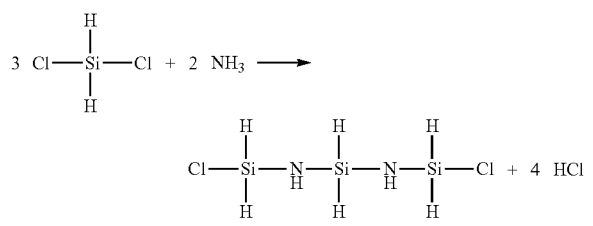

In this way, a polysilazane compound containing both Si—NH and Si—Cl in a molecular is formed. When the compound is heated to react NH with Cl, a polysilazane resin in which a ratio of silicon atoms to nitrogen atoms, Si/N is 1.30 or more, preferably 1.32 or more can be easily produced as shown below. The heat-polymerization step will be described in detail in the explanation of the step (b).

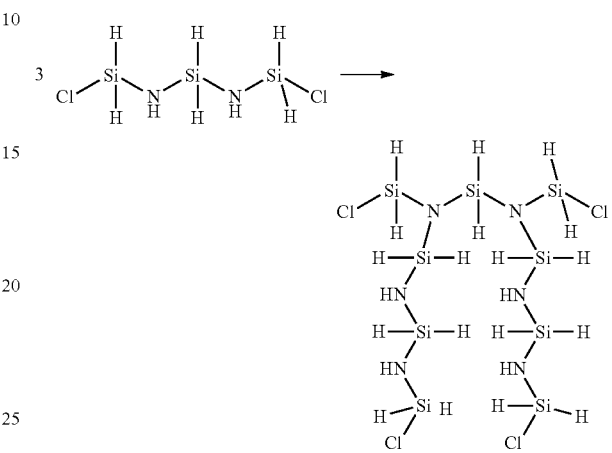

Furthermore, a polysilazane resin in which a ratio of silicon atoms to nitrogen atoms, Si/N is 1.30 or more, preferably 1.32 or more can be also produced by synthesizing a polymer with no Si—Cl bond, adding a halosilane such as dichlorosilane to this, and then heat-reacting these. The method comprising the steps of;

(a) ammonolysis of dichlorosilane in an organic solvent to produce a polymer containing virtually no chlorosilane, (b) then, adding a chlorosilane-containing material to the system and heating the system to polymerize the chlorosilane-containing material with the polymer obtained in the step (a) (see the following formulae, for example), and (c) terminal treatment of Si—Cl remained in the resin with ammonia, if needed.

In addition, in the step (b), a catalyst may be added, if necessary. A preferred compound as the catalyst is a tertiary amine.

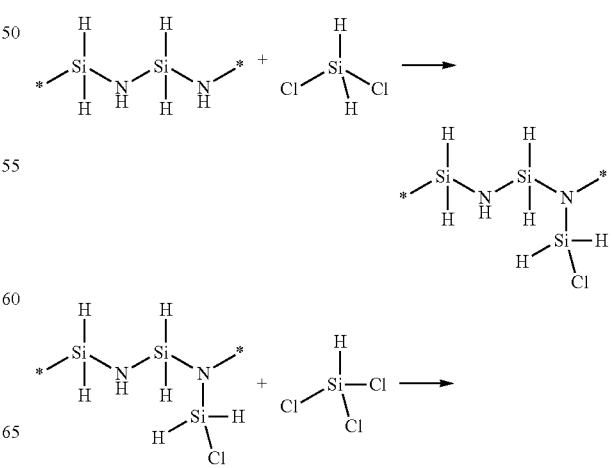

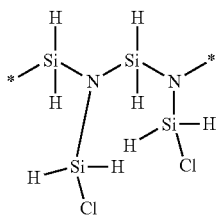

As an example of the ammonolysis described above, a method of reacting a dihalosilane represented by the formula: $SiH_2X_2$ (wherein, X represents F, Cl, Br or I) with a base to form adducts of dihalosilane and then reacting the adducts with ammonia (see Patent literature 1, for example) will be explained hereinafter. As the dihalosilane used in the reaction, dichlorosilane is particularly preferred from the point of view of reactivity and price of a raw material. The halosilane is acidic generally and can be reacted with a base to form adducts. The adducts-forming rate and the stability of adducts depend on the degree of an acidity of halosilane and the basicity degree and steric factor of the basic material. Therefore, by selecting the kinds of the halosilane and the base suitably, there can be produced stable adducts by which an inorganic polysilazane resin can be easily produced. This stability of adducts does not necessarily mean a stability of such a degree that can be isolated as adducts. It includes all the cases such as a case that adducts exist stably in a solvent and a case that adducts function substantially as a reaction intermediate.

Examples of the base include a Lewis base, tertiary amines, pyridine, picoline and derivatives thereof, secondary amines having a steric hindrance group, phosphine, stibine, and derivatives thereof. Of these, bases having a low boiling point and a smaller basicity than ammonia are preferred and pyridine and picoline are particularly preferred from the point of view of handling and economic efficiency. Furthermore, the base should be used in a stoichiometric excessive amount to the silane. The ammonolysis is conducted in a reaction solvent, for example, a light solvent such as hexane, benzene, pyridine, methylene chloride, ether, and acetonitrile. As pyridine used as a base can be also used as a solvent, it is preferred that the oligomer is formed by adding a dihalosilane to excessive pyridine, followed by injecting ammonia into the solution to ammonolysis, from the point of view of simplicity of reaction processes and the like. This reaction is proceeded by, for example, the following processes. That is, dichlorosilane having a purity of 99% or more is injected into dehydrated pyridine adjusted to the temperature of −40° C. to 20° C. under stirring, and in continuation, ammonia having a purity of 99% or more is injected into the solution adjusted to the temperature of −40° C. to 20° C. under stirring. The amount of ammonia is suitably made to an amount of ⅔ moles relative to 1 mole of dihalosilane as described above. In this step, a crude polysilazane and ammonium chloride which is a by-product are produced. The ammonium chloride produced by the reaction can be removed by a filtration, if needed.

Next, the step (b) will be explained. The step (b) is a step in which a (condensation) polymerization of the oligomer produced in the step (a) is carried out by heating. In the step (b), the oligomer is heated in the dissolved state in a reaction solvent. For example, when the oligomer was produced by adding a dihalosilane to an excessive amount of pyridine followed by adding ammonia to the reaction liquid obtained as described above, an organic solvent is optionally added to the reaction liquid obtained in the step (a) and then the reaction liquid is heated to remove ammonia. At this time, the reaction temperature, reaction time etc. are regulated as a polysilazane having a polystyrene conversion weight-average molecular weight of 1,200 to 20,000 can be obtained. The regulation of the molecular weight may be conducted by other methods such as regulating the concentration of the reaction system, the reaction pressure, and the stirring speed.

In the step (b), a trifunctional resin of nitrogen atom is formed by reacting NH in one oligomer with terminal Si—Cl in another oligomer as shown in the following formula, by heating. In this reaction, the temperature of the system is preferably 40° C. to 200° C. The higher the temperature becomes, the faster the reaction rate becomes. However, the loads of the apparatus are increased as the reaction temperature becomes higher. Usually, an inorganic polysilazane having a weight-average molecular weight of 1,200 to 20,000 in terms of polystyrene is produced by the reaction at 100° C. to 200° C. for 2 hours to 10 hours.

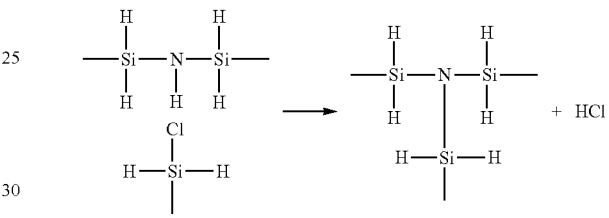

Examples of solvent include: (A) aromatic hydrocarbons such as benzene, toluene, xylene, ethylbenzene, diethylbenzene, trimethylbenzene, triethylbenzene, and decahydronaphthalene; (B) liner saturated hydrocarbons such as n-pentane, i-pentane, n-hexane, i-hexane, n-heptane, i-heptane, n-octane, i-octane, n-nonane, i-nonane, n-decane, and i-decane; (C) cyclic saturated hydrocarbons such as cyclohexane, ethylcyclohexane, methylcyclohexane, and p-menthane; (D) cyclic unsaturated hydrocarbons such as cyclohexene and dipentene (limonene); (E) ethers such as dipropyl ether, dibutyl ether, diethyl ether, methyl tertiary-butyl ether (MTBE), and anisole; and so on In the process (b), a catalyst may be added for proceeding the reaction of Si—NH with Si—Cl. As the catalyst, tertiary amines are effective. Examples of the tertiary amines include tertiary lower-alkylamines, for example, having 1 to 5 carbon atoms such as triethylamine, trimethylamine, diethylpropylamine, and N-ethyldiisopropylamine. Further, the tertiary amines may contain plural amino groups in a molecular and examples thereof include N,N,N',N'-tetramethyldiaminomethane, N,N,N',N'-tetramethylethylenediamine, and the like. Furthermore, as tertiary amines having a cyclic structure, 1-ethylpyrroridine, 2,6-lutidine, 4-methylmorpholine, 1-ethylpiperidine, and the like are cited.

The amount of the catalyst is usually 0.01 to 20 times moles the amount of the oligomer, preferably 0.1 to 5 times moles, though it is varied by a catalyst used and so on. When the catalyst is used, an inorganic polysilazane having a polystyrene conversion weight-average molecular weight of 1,200 to 20,000 is produced by reacting usually for 30 minutes to 5 hours at 60° C. to 150° C., though the reaction temperature and the reaction time are varied depend on the catalyst used.

The step (c) is a step which is conducted for removing Si—Cl in the resin produced in the aforementioned step (b).

The step (c) is to terminate Si—Cl by reacting with ammonia. When Si—Cl remains in the resin, Cl will be easily dissociated in the later steps and it causes various failures. This step, therefore, is required. In this step, excessive $NH_3$ can be supplied to, for example, a reaction liquid obtained in the step (b) or a liquid in which an inorganic polysilazane resin obtained in the step (b) is dissolved in a solvent. Unreacted Si—Cl reacts with $NH_3$ to form a hydrochloric acid salt. The hydrochloric acid salt is precipitated and the precipitate is removed using a filter.

The obtained inorganic polysilazane-containing solution is distilled under a reduced pressure to obtain an inorganic polysilazane resin. When the reaction liquid includes pyridine and other organic solvents as described above, pyridine is usually removed by distillation and the organic solvents are removed, as needed. When the concentration of the polysilazane resin in the organic solvent solution is adjusted to, for example, 5 to 30 weight % by a vacuum distillation, the polysilazane-containing solution obtained can be used as a coating liquid as it is or a base liquid for a coating composition. A coating composition may be formed by adding other additives or solvents to the base liquid of a coating composition if needed.

Thus, an inorganic polysilazane resin having a ratio of silicon atoms to nitrogen atoms (Si/N) of 1.30 or more, preferably 1.32 or more is obtained. In the point of view of the solubility in the organic solvent and the shape of the coated film, as described above, the weight-average molecular weight in terms of polystyrene of the inorganic polysilazane resin of the present invention is preferably 1.200 to 20.000.

The inorganic polysilazane resin of the present invention is dissolved in an organic solvent and made to a solution, namely, a coating composition. The coating composition is applied to a substrate. The coated film is dried, then subjected to an oxidation step, and, if necessary, annealed to form an insulation film, a planarization film, a protective film, a passivation film, a hard mask, a stress adjusting film, a sacrifice film, and the like. In addition, the isolation region may be formed by filling the trench with the coating composition, drying it, and then subjecting to an oxidation process.

The coating composition containing the inorganic polysilazane resin of the present invention will be described hereinafter. The coating composition of the present invention comprises an organic solvent other than the aforementioned inorganic polysilazane resin. The organic solvent may be any one which can dissolve the inorganic polysilazane resin of the present invention and additives if used, and does not react with the inorganic polysilazane resin and the additives. Preferred examples thereof include, but are not limited to, the same organic solvents as those exemplified in the step (b) described above.

Mixture of two kinds or more of solvents are suitably used as the solvent for controlling an evaporation rate of solvent, lowering harmfulness to the human body or adjusting solubility of components contained in the coating composition. Furthermore, the inorganic polysilazane resin solution used for the coating composition may be prepared by dissolving a solid resin in an organic solvent as described above, or by using an inorganic polysilazane solution as it is, which is obtained without isolating the inorganic polysilazane resin at the synthesis of the polysilazane resin, or by diluting the inorganic polysilazane solution, or by further concentrating the inorganic polysilazane solution by a vacuum distillation.

The coating composition containing an inorganic polysilazane resin of the present invention may further comprise a compound which promotes a silica conversion reaction. The compound which promotes a silica conversion reaction means a compound promoting a reaction in which polysilazane is converted to a siliceous material by an interaction with polysilazane. Various compounds has been known as the compound which promotes a silica conversion reaction, for example, compounds described in JP 06-299118 A can be used as the compound. More specifically, compounds (i) to (iii) described below can be represented.

(i) Metal Carboxylates

As the metal carboxylates, metal carboxylates containing nickel, titanium, platinum, rhodium, cobalt, iron, ruthenium, osmium, palladium, iridium, or aluminum are particularly preferred. When these metal carboxylates are used as a promoting compound, the amount thereof are made to usually 0.01 to 20 weight-%, preferably 0.1 to 10 weight-%, more preferably 0.5 to 5 weight-% relative to the weight of the polysilazane compound. When the amount used exceeds 20 weight %, the composition can be gelled and when the amount used is smaller than 0.01 weight %, the effect of the present invention cannot be obtained. It is, therefore, necessary to be careful for the amount used.

(ii) N-heterocyclic Compounds

As the N-heterocyclic compounds, N-heterocyclic compounds which do not show aromaticity are preferred. Specific examples thereof include 1,3-di-4-piperidylpropane, 4,4'-trimethylenebis(1-methylpiperydine), diazabicyclo-[2,2,2]octane, and cis-2,6-dimethylpiperazine. When these N-heterocyclic compounds are used as the promoting compound, the amount used is made to usually 0.01 to 50 weight %, preferably 0.1 to 10 weight % relative to the weight of the inorganic polysilazane compound. It is preferable that a larger amount of N-heterocyclic compound promotes a conversion to silica. However, when a larger amount of the N-heterocyclic compound is used, it should be careful as the density of a siliceous film may decrease or the handleability of the composition may become worse by deterioration of stability of the polysilazane.

(iii) Amine Compounds

As the amine compounds, there are exemplified amine compounds represented by the following formula (A) or (B).

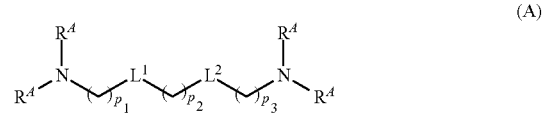

(A)

In the formula (A), $R^A$s represent each independently a hydrogen atom or a $C_1$-$C_3$ hydrocarbon group and two $R^A$s attached to the same nitrogen atom are not a hydrogen atom simultaneously, $L^1$ and $L^2$ are each independently —$CH_2$—, —$NR^{41}$— (whereas $R^{41}$ is a hydrogen atom or a $C_1$-$C_4$ hydrocarbon group) or —O—, $p_1$ and $p_3$ are each independently an integer of 0 to 4, and $p_2$ is an integer of 1 to 4.

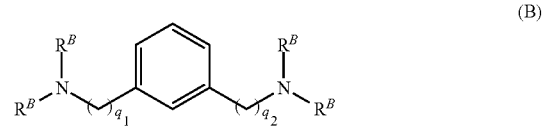

(B)

In the formula (B), $R^B$s represent each independently a hydrogen atom or a $C_1$-$C_4$ hydrocarbon group, and $q_1$ and $q_2$ are each independently an integer of 1 to 4.

The blending amount of the amine compound is usually 1 to 20%, preferably 3 to 10%, more preferably 4 to 8%, further more preferably 4 to 6% relative to the weight of the polysilazane compound. The blending amount of the amine compound is preferably a given amount or more for obtaining a maximum effect of improving a promotion of the reaction and a density of a film, but on the other hand, the amount is preferably a given amount or less for maintaining the solubility of the composition and preventing the film unevenness detection when forming a film.

To the coating composition containing the polysilazane resin, other additives may be added if needed. For example, such additives are a viscosity adjusting agent, a crosslinking promoter etc. Phosphorus compounds such as tris(trimethylsilyl)phosphate may also be contained in the coating composition containing the polysilazane resin for a gettering effect of sodium when used in a semiconductor device. The inorganic polysilazane resin-containing solution obtained are preferably circulating-filtered using a filter having a pore size of 0.1 μm or less to reduce coarse particles having a particle size of 0.2 μm or more to 50 particles/cc or less.

The solid content of each element described above is varied by application conditions, baking conditions, and so on. The solid content of the inorganic polysilazane resin is preferably 0.1 to 40 weight %, more preferably 0.2 to 30 weight %, further more preferably 0.3 to 25 weight % relative to the total weight of the coating composition. In addition, the contents of various kinds of additives other than the inorganic polysilazane resin are preferably 0.001 to 40 weight %, more preferably 0.005 to 30 weight %, further more preferably 0.01 to 20 weight % relative to the weight of the polysilazane compound, though those are varied by the kinds of the additives etc.

Coating methods of the inorganic polysilazane resin-containing composition are, a spin coat method, a dip coat method, a spray coat method, a roll coat method, a transfer method, a slit coat method, and so on. The spin coat method is particularly preferred. The coated film having the desired film thickness can be formed by one application action or 2 or more of repeating application actions, if necessary. Examples of the substrate to which the coating composition is applied including a silicon substrate, a glass substrate, a resin film, etc. The coating composition may be applied to a substrate on which a semiconductor film, a circuit, or the like was formed in a production process of a semiconductor element, if necessary. The thickness of the coated film is usually 10 to 2,000 nm, preferably 20 to 1,000 nm in a dried film thickness though it is varied by the purpose of the use of film.

After the coated film of the polysilazane resin was formed by application of the coating composition as described above, the coated film is preferably prebaked (heat-treated) for drying. This process is performed for complete removal of solvent contained in the coated film and precure of the coated film in the final step of the application process. Usually, in the prebake process, the baking temperature is held at a substantially constant temperature. However, the baking temperature in the prebake process may be controlled as is raised with time during the prebake process for preventing a formation of concave in the substrate, which is occurred by shrinkage of the coated film, and occurrence of voids in the trench. The temperature in the prebake process is usually in the range of 50° C. to 300° C., preferably 70° C. to 200° C. The required time for the prebake process is usually 10 seconds to 30 minutes, preferably 30 seconds to 5 minutes. After the prebake, a treatment liquid containing an oxidation accelerator (a cure accelerator) may be applied to the coated polysilazane film, if necessary.

In the oxidation process, any treatment methods conventionally known in the oxidation process of the polysilazane may be adopted. The polysilazane is oxidized by the method to form a siliceous film having excellent properties. The oxidation is conducted using a curing oven or a hot plate. As preferred methods, there are exemplified methods of conducting heat treatments under an inert gas or oxygen atmosphere which contains water vapor, a method of conducting a heat treatment under a water vapor atmosphere containing hydrogen peroxide vapor, etc.

The concentration of water vapor in the water vapor oxidation is an important factor for converting the polysilazane resin to a siliceous film (silicon dioxide) and is preferably 1% or more, more preferably 10% or more, most preferably 20% or more. Particularly, when the content of water vapor is 20% or more, the conversion of polysilazane resin to a siliceous film proceeds easily, defects of the film such as voids is suppressed, and properties of the siliceous film are improved. When an inert gas is used as the atmosphere gas, nitrogen gas, argon gas, helium gas, and the like are used. The treatment temperature is varied by the composition of the coating liquid and, generally, the conversion rate to a siliceous film tends to become faster in a higher temperature. On the other hand, adverse influences to device properties by oxidation of a silicon substrate or change of the crystal structure tend to become smaller in a lower temperature. From these points of view, it is desirable that heating is conducted at usually 900° C. or lower, preferably 200° C. to 500° C. It is desirable that the heating rate to the target temperature is generally 0.1 to 100° C./minute and the curing time at the target temperature is generally 1 minute to 10 hours, preferably 15 minutes to 3 hours. The treating temperature and the composition of the treatment atmosphere may be changed gradually, if necessary.

The coated film can be oxidized by exposing it to a hydrogen peroxide vapor. In this case, the coated film may be placed under a hydrogen peroxide vapor atmosphere at a temperature of 50° C. to 200° C. for one minute to 2 hours. At this time, other vapor such as water vapor or dilution gas may be contained in the hydrogen peroxide vapor atmosphere. Generally, the higher the concentration of hydrogen peroxide is, the faster the oxidation rate of the coated film becomes.

The inorganic polysilazane resin in the coated film is converted to a siliceous film (silicon dioxide). The converted film may be further subjected to an annealing treatment process in which the whole of the substrate is heated for completely converting and curing all of the polysilazane-coated film to silica, if necessary. The annealing treatment is usually conducted by putting and heating the whole of the substrate in a curing oven and the like, generally. The annealing treatment may be conducted under a non-oxidizing atmosphere or an oxidizing atmosphere. The annealing temperature is usually 300° C. to 1,100° C., preferably 400° C. to 1,000° C. and the treatment time is usually 10 minutes to 5 hours, preferably 30 minutes to 2 hours.

In the present invention, one or more of thin coated films may be further formed on the coated film by repeating these processes, if needed. By forming two or more of coated films, the thickness of each formed film can be reduced. As a result, when each of the coated thin films is cured, the sufficient diffusion and supply of oxygen from the surface of the film can be carried out at any portion of the depth direction of the coated thin film and a siliceous film having more excellent properties can be formed.

EXAMPLES

Hereinafter, the invention will be specifically described with reference to Examples and Comparative examples. However, it should be understood that the present invention is not restricted by these Examples and Comparative examples. In addition, weight-average molecular weights in terms of polystyrene of synthesized inorganic polysilazane resins were measured by the following method.

<Measurement of the Weight-Average Molecular Weight>

The weight-average molecular weight was measured using a GPC apparatus manufactured by Shimadzu Corporation with a THF eluent.

Example 1

Three moles (303 g) of dichlorosilane having a purity of 99% or more were injected into a mixed solvent consisting of 1 kg of dehydrated pyridine and 3 kg of dibutyl ether at −30° C. under stirring. While maintaining the temperature of the solution at −30° C., 2 moles (34 g) of ammonia gas having a purity of 99.9% or more were injected into the mixture under stirring. The mixture was reacted for 2 hours while maintaining the temperature at −30° C. to obtain a solution of silazane oligomer containing unreacted Si—Cl. The existence of the unreacted Si—Cl was confirmed by using FTIR, VIR-9450 manufactured by JASCO Corporation.

The oligomer obtained contains following compounds and the like, and the total number of NH and the total number of Cl in the oligomer are the same.

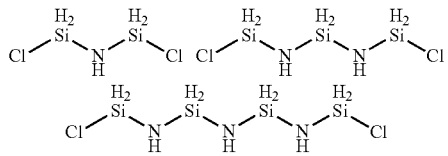

In the oligomer formation process, HCl was generated but most of it was reacted immediately with excessive pyridine to form pyridine hydrochloride and the pyridine hydrochloride formed was precipitated. The pyridine hydrochloride was removed with a glass filter.

To the reaction solution obtained, 0.5 moles (50 g) of triethylamine were added and the reaction system was heated gradually to 120° C. and held at 120° C. for 1 hour. Then, the solution was cooled gradually to the room temperature to form a slurry reaction mixture. The thus obtained reaction mixture was filtered with a glass filter for removing pyridine hydrochloride to obtain a filtrate. To the filtrate obtained, dibutyl ether was added and the mixture was heated to 50° C., followed by distillation under the reduced pressure of 20 mmHg to remove pyridine at this temperature. Through these processes, Solution A having a concentration of 20% by weight, which contains a resin (Resin A) having a weight-average molecular weight of 5,650, was obtained.

Example 2

A silazane oligomer solution containing unreacted Si—Cl was prepared by the same process as Example 1. To the silazane oligomer solution obtained, 2 moles (204 g) of N,N,N',N'-tetramethyldiaminomethane were added and this reaction system was heated gradually to 80° C. under stirring and held at this temperature for one hour, followed by cooling down gradually to the room temperature. Subsequently, 1 mole (17 g) of ammonia gas having a purity of 99.9% was injected again to the mixture under stirring and then the mixture was allowed to stand for 30 minutes. The obtained slurry reaction mixture was filtered with a glass filter to remove pyridine hydrochloride to obtain a filtrate. To the filtrate obtained, dibutyl ether was added and then heated to 50° C., followed by distillation under the reduced pressure of 20 mmHg to remove pyridine at this temperature. Through these processes, Solution B having a concentration of 20% by weight, which contains a resin (Resin B) having a weight-average molecular weight of 4,450, was obtained.

Example 3

Three moles (303 g) of dichlorosilane having a purity of 99% or more were injected into a mixed solvent consisting of 300 g of dehydrated pyridine and 3 kg of dibutyl ether under stirring at 0° C. While maintaining the temperature of the solution at 0° C., 3 moles (51 g) of ammonia gas were injected into the mixture under stirring. The mixture was reacted for 2 hours under stirring while maintaining the temperature at 0° C. to obtain a solution of polysilazane polymer. It was confirmed by FTIR, VIR-9450 manufactured by JASCO Corporation that the polymer does not contain the unreacted Si—Cl. The molecular weight of the polymer was 2,300. Pyridine hydrochloride and ammonium chloride, which were formed in the synthesis process of the polysilazane polymer, were removed by filtration with a centrifugal separation filter.

Subsequently, 1 mole (107 g) of 2,6-lutidine was added to the filtrate and then the reaction system was heated gradually to 90° C., followed by injecting 1 mole (101 g) of dichlorosilane at a flow rate of 0.5 L/min under stirring. Then, the solution was cooled down to 0° C. and 1 mole (17 g) of ammonia gas having a purity of 99.9% was injected into the mixture under stirring for removing the unreacted Si—Cl. The obtained slurry reaction mixture was filtered with a glass filter to remove pyridine hydrochloride and a filtrate was obtained. To the filtrate, dibutyl ether was added and then heated to 50° C., followed by distillation under the reduced pressure of 20 mmHg to remove pyridine at this temperature. Through these processes, Solution C having a concentration of 20% by weigh, which contains a resin (Resin C) having a weight-average molecular weight of 7,450, was obtained.

Comparative Example 1

Three moles (303 g) of dichlorosilane having a purity of 99% or more were injected into a mixed solvent consisting of 300 g of dehydrated pyridine and 3 kg of dibutyl ether at −30° C. under stirring. While maintaining the temperature of the solution at −30° C., 2 moles (34 g) of ammonia gas having a purity of 99.9% were injected into the mixture under stirring. The mixture was reacted for 3 hours under stirring while maintaining the temperature at −30° C. The obtained slurry reaction mixture was filtered with a glass filter to remove pyridine hydrochloride and a filtrate was obtained. It was confirmed by FTIR, VIR-9450 manufactured by JASCO Corporation that the solution contained the unreacted Si—Cl. However, when the reaction mixture was exposed to the air, it absorbed water vapor and emitted white smoke (which is hydrochloric acid). Therefore, it was unsuitable for the precursor of insulator and the evaluation thereof was stopped.

Comparative Example 2

A polysilazane polymer was prepared by the same process as Example 3. That is, 3 moles (303 g) of dichlorosilane having a purity of 99% or more were injected into a mixed solvent consisting of 300 g of dehydrated pyridine and 3 kg of dibutyl ether under stirring at 0° C. While maintaining the temperature of the solution at 0° C., 3 moles (51 g) of ammonia gas were injected to the mixture under stirring. The mixture was reacted for 2 hours under stirring while maintaining the temperature at 0° C. The slurry reaction mixture obtained was filtered with a glass filter to remove pyridine hydrochloride and a filtrate was obtained. To the filtrate obtained, dibutyl ether was added and then heated to 50° C., followed by distillation under the reduced pressure of 20 mmHg to remove pyridine at this temperature. Through these processes, Solution D having a concentration of 20% by weight, which contains a resin (Resin D) having a weight-average molecular weight of 2,400, was obtained.

<Measurement of a Ratio of Silicon Atoms to Nitrogen Atoms (Si/N)>

Each of Solutions A to D was applied to a silicon wafer and dried for 3 minutes at 50° C. to remove solvent. In this process, a spin coater, 1H-DX2 made by MIKASA Co., LTD and a hot plate, Charming HHP-412 made by AS ONE Corporation were used. Samples were measured by RBS (Rutherford Backscattering Spectrometry) using Pelletron 3SDH manufactured by National Electrostatics Corp. as a measurement device. The results are shown in Table 1. From the results mentioned in Table 1, it was confirmed that Resins A to C were polymers in which many silicon atoms were contained.

TABLE 1

|  | Example 1 Resin A | Example 2 Resin B | Example 3 Resin C | Comparative example 2 Resin D |
|---|---|---|---|---|
| Si/N | 1.41 | 1.32 | 1.54 | 1.28 |

<Measurement of a Shrinkage Rate and a Residual Stress of a Baked Film>

Each of Resins A to D prepared in Examples 1 to 3 and Comparative example 2 was spin-coated on a silicon wafer, heated to 150° C., and maintained at this temperature for 3 minutes to evaporate the solvent. As a result, a film with 500 nm in thickness was obtained. The samples were baked in the steam baking furnace, VF-1000 manufactured by Koyo Thermo Systems Co., Ltd. for 1 hour at 350° C. under an 80% steam atmosphere. Subsequently, the steam atmosphere was changed to a nitrogen atmosphere and the samples were annealed for 1 hour at 850° C. The shrinkage and the residual stress of each film were measured and evaluated according to the methods described below. The results are shown in Table 2.

(Shrinkage)

The shrinkage was calculated by the following formula. In the formula, "base film thickness" was defined as a film thickness after drying at 150° C. for 3 minutes.

Shrinkage (%)={[(base film thickness)−(film thickness after anneal treatment)]/(base film thickness)}×100

The film thickness was measured using the reflecting spectrographic film thickness meter made by OTSUKA ELECTRONICS CO. LTD.

(Residual Stress)

The residual stress was measured using FLX-2320 made by Tencor.

The measuring theory is as follows. When a film applied on a silicon wafer has a residual stress, the substrate (silicon wafer) will bend. The curvature radius of the substrate is measured and a stress value is calculated from the value of the measured curvature radius.

TABLE 2

|  | Example 1 Resin A | Example 2 Resin B | Example 3 Resin C | Comparative example 2 Resin D |
|---|---|---|---|---|
| Shrinkage | 12% | 14% | 10% | 20% |
| Residual stress | 5 MPa | 10 MPa | 20 MPa | 20 MPa |

From Table 2, it is known that problems of shrinkage and residual stress of a siliceous conversion film can be significantly improved by forming a siliceous film by use of the inorganic polysilazane resin having a high Si content rate of the present invention, in comparison with a case where a siliceous film is formed by use of the conventionally known inorganic polysilazane having a low Si content rate, which is shown in Comparative example.

The invention claimed is:

1. A method for forming a siliceous film, wherein a coating composition comprising an inorganic polysilazane resin is applied to a substrate and oxidized by contacting with a water vapor under a heated condition after drying, wherein said inorganic polysilazane resin is one formed by heating an inorganic polysilazane compound containing both Si—NH and Si—Cl to react NH with Cl, wherein the ratio of containing silicon atoms to containing nitrogen atoms, Si/N in said polysilazane resin is 1.30 or more, and further wherein, said heating is conducted in the presence of a catalyst.

2. A method for forming a siliceous film, wherein the coating composition according to claim 1 is applied to a substrate and oxidized by contacting with a hydrogen peroxide vapor and a water vapor under a heated condition after drying.

3. The method according to claim 1, wherein said ratio of contained silicon atoms to contained nitrogen atoms in said inorganic polysilazane resin, Si/N is 1.32 or more.

4. The method according to claim 1, wherein Si/N is 1.40 or more.

5. The method according to claim 1, wherein the catalyst is a tertiary amine.

6. The method according to claim 1, wherein the weight-average molecular weight, in terms of polystyrene, of said inorganic polysilazane resin is 1,200 to 20,000.

7. A method for forming a siliceous film, wherein a coating composition comprising an inorganic polysilazane resin is applied to a substrate and oxidized by contacting with a water vapor under a heated condition after drying, wherein said inorganic polysilazane resin is one formed by heating an inorganic polysilazane compound containing both Si—NH and Si—Cl to react NH with Cl, wherein the ratio of containing silicon atoms to containing nitrogen atoms, Si/N in said polysilazane resin is 1.30 or more, wherein said inorganic polysilazane is synthesized by thermally reacting a silazane oligomer or polymer with no Si—Cl bond, with a halosilane.

8. The method according to claim 7, wherein the halosilane is a dihalosilane.

9. The method according to claim 7, wherein said heating is conducted in the presence of a catalyst.

10. The method according to claim 9, wherein said catalyst is a tertiary amine.

* * * * *